(12) United States Patent
Yakushiji et al.

(10) Patent No.: US 12,438,075 B2
(45) Date of Patent: Oct. 7, 2025

(54) METHOD FOR MANUFACTURING A LAMINATED BODY

(71) Applicant: CANON ANELVA CORPORATION, Kanagawa (JP)

(72) Inventors: Hiroshi Yakushiji, Kanagawa (JP); Reiji Sakamoto, Kanagawa (JP); Masahiro Shibamoto, Kanagawa (JP)

(73) Assignee: CANON ANELVA CORPORATION, Kanagawa (JP)

( * ) Notice: Subject to any disclaimer, the term of this patent is extended or adjusted under 35 U.S.C. 154(b) by 224 days.

(21) Appl. No.: 18/169,449

(22) Filed: Feb. 15, 2023

(65) Prior Publication Data

US 2023/0187338 A1 Jun. 15, 2023

Related U.S. Application Data

(63) Continuation of application No. PCT/JP2021/018766, filed on May 18, 2021.

(51) Int. Cl.
*H01L 21/48* (2006.01)
*C23C 14/20* (2006.01)
(Continued)

(52) U.S. Cl.
CPC ...... *H01L 23/49894* (2013.01); *C23C 14/205* (2013.01); *C23C 14/3464* (2013.01); *C23C 14/5833* (2013.01); *C23C 14/5846* (2013.01); *C23C 28/32* (2013.01); *C23C 28/341* (2013.01); *C25D 7/123* (2013.01); *H01J 37/3053* (2013.01); *H01J 37/3178* (2013.01); *H01J 37/32082* (2013.01); *H01L 21/4846* (2013.01); *H01L 23/49838* (2013.01); *H01J 2237/332* (2013.01); *H01J 2237/334* (2013.01)

(58) Field of Classification Search
CPC ......... H01L 23/49894; H01J 37/32082; C23C 14/205; C23C 14/5833; C23C 14/5846; C23C 28/32; C23C 28/341; H05K 3/18; Y10T 29/49155; Y10T 29/49165
See application file for complete search history.

(56) References Cited

U.S. PATENT DOCUMENTS 6,517,339 B1 2/2003 Miya et al.
6,720,659 B1 4/2004 Akahori
(Continued)

FOREIGN PATENT DOCUMENTS

CN 101492811 A 7/2009
CN 104350174 A 2/2015
(Continued)

OTHER PUBLICATIONS

Office Action in Taiwanese Application No. 112133612 (Jan. 2024).
(Continued)

*Primary Examiner* — Donghai D Nguyen
(74) *Attorney, Agent, or Firm* — Venable LLP

(57) ABSTRACT

Provided are a laminated body and a laminated body manufacturing method that can improve adhesiveness between a resin layer and a seed layer. The laminated body has a substrate, a first wiring layer, a resin layer, and a second wiring layer in this order, and the second wiring layer includes at least an adhesive layer and a seed layer in this order.

9 Claims, 10 Drawing Sheets

(51) Int. Cl.
*C23C 14/34* (2006.01)
*C23C 14/58* (2006.01)
*C23C 28/00* (2006.01)
*C25D 7/12* (2006.01)
*H01J 37/305* (2006.01)
*H01J 37/317* (2006.01)
*H01J 37/32* (2006.01)
*H01L 23/498* (2006.01)

(56) References Cited

U.S. PATENT DOCUMENTS

| | | | |
|---|---|---|---|
| 6,821,624 B2 * | 11/2004 | Utsumi | C23C 16/0272 |
| | | | 428/408 |
| 8,237,292 B2 | 8/2012 | Shibuya et al. | |
| 8,276,270 B2 | 10/2012 | Hotta et al. | |
| 8,669,138 B2 | 3/2014 | Shibuya et al. | |
| 9,101,067 B2 | 8/2015 | Ishizaka et al. | |
| 9,252,218 B2 * | 2/2016 | Tsuji | H01L 21/0485 |
| 9,363,900 B2 | 6/2016 | Takasawa et al. | |
| 9,790,590 B2 | 10/2017 | Furukawa et al. | |
| 10,014,362 B2 | 7/2018 | Jo et al. | |
| 10,153,135 B2 | 12/2018 | Wilby et al. | |
| 10,515,848 B1 | 12/2019 | Kuo et al. | |
| 10,658,234 B2 | 5/2020 | Hung et al. | |
| 10,738,380 B2 | 8/2020 | Nozawa et al. | |
| 10,840,129 B2 | 11/2020 | Kuo et al. | |
| 10,879,224 B2 | 12/2020 | Chen et al. | |
| 11,404,308 B2 | 8/2022 | Kuo et al. | |
| 11,569,070 B2 | 1/2023 | Sekiya et al. | |
| 11,600,466 B2 | 3/2023 | Tanabe et al. | |
| 11,600,469 B2 | 3/2023 | Takeda et al. | |
| 11,626,270 B2 | 4/2023 | Inoue et al. | |
| 11,756,773 B2 | 9/2023 | Sekiya et al. | |
| 11,784,030 B2 | 10/2023 | Takeda et al. | |
| 11,961,710 B2 | 4/2024 | Inoue et al. | |
| 2002/0002413 A1 | 1/2002 | Tokue | |
| 2006/0269656 A1 | 11/2006 | Boroson et al. | |
| 2006/0273323 A1 * | 12/2006 | Yamamoto | H01L 29/1608 |
| | | | 257/77 |
| 2010/0326709 A1 | 12/2010 | Kawano et al. | |
| 2011/0204519 A1 * | 8/2011 | Chikaki | H01L 23/53238 |
| | | | 257/E23.165 |
| 2020/0126763 A1 | 4/2020 | Sekiya et al. | |
| 2020/0312768 A1 | 10/2020 | Nad et al. | |
| 2022/0336376 A1 | 10/2022 | Yu et al. | |
| 2023/0002886 A1 | 1/2023 | Yakushiji et al. | |

FOREIGN PATENT DOCUMENTS

| | | |
|---|---|---|
| CN | 204898063 U | 12/2015 |
| CN | 106298423 A | 1/2017 |
| CN | 106795626 A | 5/2017 |
| CN | 109415804 A | 3/2019 |
| CN | 110129761 A | 8/2019 |
| JP | 2-50959 A | 2/1990 |
| JP | 4-99271 A | 3/1992 |
| JP | 6-37074 A | 2/1994 |
| JP | 7-310180 A | 11/1995 |
| JP | 8-55804 A | 2/1996 |
| JP | 9-320963 A | 12/1997 |
| JP | 2000-254922 A | 9/2000 |
| JP | 2003-218516 A | 7/2003 |
| JP | 2009-10276 A | 1/2009 |
| JP | 2010-106290 A | 5/2010 |
| JP | 2016-069684 A | 5/2016 |
| JP | 2016-086047 A | 5/2016 |
| JP | WO2016/056275 A1 | 7/2017 |
| JP | 2019-129172 A | 8/2019 |
| KR | 10-2017-0032524 A | 3/2017 |
| TW | 403942 B | 9/2000 |
| TW | 2014-40152 A | 10/2014 |
| TW | 202008481 A | 2/2020 |
| TW | 202015495 A | 4/2020 |
| TW | 202017131 A | 5/2020 |
| TW | 202105629 A | 2/2021 |
| WO | 2008/105535 A1 | 9/2008 |
| WO | 2014/185301 A1 | 11/2014 |
| WO | 2016/056275 A1 | 4/2016 |
| WO | 2018/228683 A1 | 12/2018 |
| WO | 2022/244095 A1 | 11/2022 |

OTHER PUBLICATIONS

Office Action in Taiwanese Application No. 112133612 (Oct. 2023).
Office Action in Taiwanese Application No. 111112416 (Jun. 2023).
Office Action in Taiwanese Application No. 111112416 (Feb. 2023).
Notification of Reason for Refusal in Korean Application No. 10-2023-7006932 (Jul. 2024).
Office Action in Taiwanese Application No. 112120037 (Jul. 2023).
Notification of Reason for Refusal in Korean Application No. 10-2022-7030318 (Jul. 2024).
First Office Action in Chinese Application No. 202080099470.1 (Jul. 2023).
International Search Report in International Application No. PCT/JP2021/018766 (Aug. 2021).
Office Action in Taiwanese Application No. 110108253 (Oct. 2021).
International Preliminary Report on Patentability in International Application No. PCT/JP2021/018766 (Nov. 2023).
Office Action in Taiwanese Application No. 114100895 (Jun. 2025).

* cited by examiner

METHOD FOR MANUFACTURING A LAMINATED BODY

CROSS-REFERENCE TO RELATED APPLICATIONS

This application is a Continuation of International Patent Application No. PCT/JP2021/018766, filed May 18, 2021, which is hereby incorporated by reference herein in its entirety.

BACKGROUND OF THE INVENTION

Field of the Invention

The present invention relates to a laminated body and a laminated body manufacturing method.

Description of the Related Art

In a mounting step of mounting an electronic component on a substrate including a printed substrate and a film substrate, an adhesive layer that is a ground layer for a wiring connected to the electronic component and a seed layer for forming the wiring by plating are formed on an insulating resin layer. For example, plating or sputtering is used for formation of each layer.

Japanese Patent Application Laid-Open No. 2009-10276 discloses a wiring forming method that uses electroless copper plating and provides superior adhesiveness and high connection reliability. Further, International Publication No. WO2008/105535 discloses a wiring forming method as a fine wiring forming scheme that uses a titanium (Ti)/copper (Cu) layer as a seed layer formed by sputtering, which is a mainstream of a method that can obtain adhesiveness to a smooth resin surface.

In the wiring forming method using electroless plating disclosed in Japanese Patent Application Laid-Open No. 2009-10276, however, a roughening process is applied to the surface of the insulating resin layer to ensure adhesiveness, and it is thus difficult to form a fine wiring for increasing the density of a semiconductor package because of surface unevenness.

Further, it is desirable that a wiring layer maintains adhesiveness to various insulating resin layers even under various environments such as a high-temperature, high-humidity environment, that is, be superior in reliability. According to a study by the present inventors however, it has been revealed that it is difficult to obtain sufficient adhesiveness to various insulating resin layers when using a seed layer made of a Ti layer and a Cu layer disclosed in International Publication No. WO2008/105535.

The present invention has been made in view of the above problem of the conventional art, and has an object to provide a laminated body and a laminated body manufacturing method that can improve adhesiveness between a resin layer and a seed layer.

SUMMARY OF THE INVENTION

To achieve the above object, a laminated body according to one aspect of the present invention includes: a first wiring layer; a resin layer; and a second wiring layer in this order, and the second wiring layer includes at least an adhesive layer and a seed layer in this order.

A laminated body manufacturing method according to another aspect of the present invention includes: a first step of forming a titanium film on a resin layer; after the first step, a second step of forming a titanium carbide layer forming a part of an adhesive layer by applying energy to the titanium film; after the second step, a third step of forming a titanium layer forming a part of the adhesive layer on the titanium carbide layer; and after the third step, a fourth step of forming a seed layer on the titanium layer.

A laminated body according to yet another aspect of the present invention includes: a first wiring layer; a resin layer; and a second wiring layer in this order, the second wiring layer includes an adhesive layer and a seed layer in this order, the adhesive layer includes a titanium carbide layer and a titanium layer in this order, and the titanium carbide layer is a layer formed by applying energy to a titanium film formed on the resin layer.

Further features of the present invention will become apparent from the following description of exemplary embodiments with reference to the attached drawings.

DESCRIPTION OF THE EMBODIMENTS

Embodiments of the present invention found from the present inventors' findings will be described with reference to FIG. 1 to FIG. 9.

First Embodiment

A laminated body and a manufacturing method of the same according to a first embodiment of the present invention will be described with reference to FIG. 1 to FIG. 4E. In the present embodiment, as the laminated body, a laminated body including wiring layers in a wiring part of a semiconductor package will be described.

Figure 1:
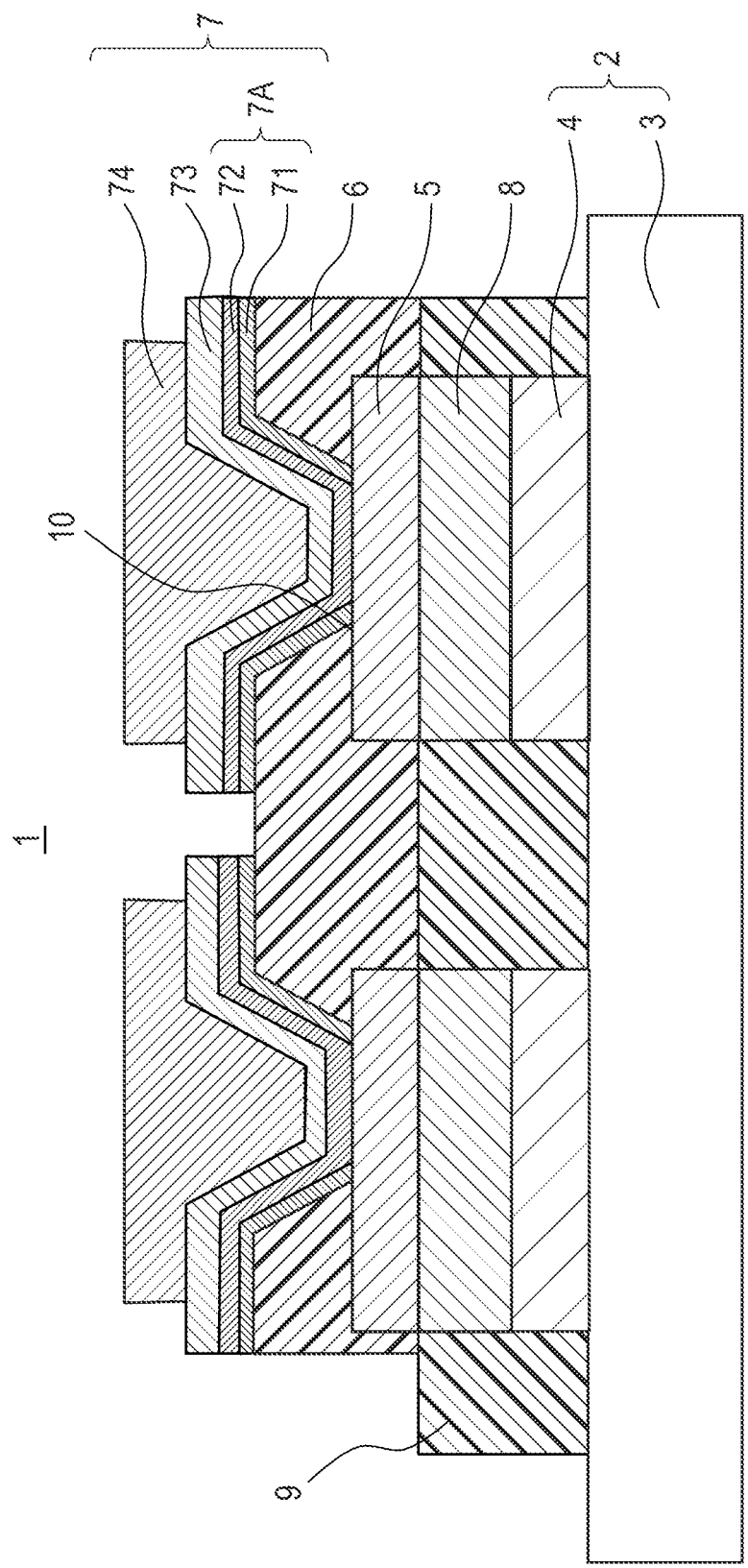
FIG. 1 is a schematic sectional view illustrating a wiring part of a semiconductor package according to a first embodiment of the present invention.

First, a wiring part of a semiconductor package according to the present embodiment will be described with reference to FIG. 1. FIG. 1 is a schematic sectional view illustrating the wiring part of the semiconductor package according to the present embodiment. As illustrated in FIG. 1, a wiring part 1 of the semiconductor package has a printed wiring substrate 2, a first wiring layer 5, a resin layer 6, and a second wiring layer 7 in this order. The wiring part 1 of the semiconductor package further has solder 8 and an underfill layer 9.

The printed wiring substrate 2 is not particularly limited, can be, for example, a known buildup substrate, and has a substrate 3 and a wiring 4 provided on the substrate 3.

The wiring 4 is a metal layer forming an inner layer wiring pattern of a buildup substrate, for example, which is the printed wiring substrate 2, and is a wiring formed by plating, for example. It is preferable to use copper or a copper alloy as the metal layer used as the wiring 4 in terms of plating adhesiveness, conductivity, and cost.

The first wiring layer 5 is a metal layer obtained by being formed on a support substrate C as described later and is a wiring formed by a semi-additive method, for example. It is preferable to use copper or a copper alloy as the metal layer used as the first wiring layer 5. The first wiring layer 5 is formed on a surface on the printed wiring substrate 2 side of the resin layer 6.

The resin layer 6 is formed of a cured resin. As the resin, for example, a polyimide based resin, an epoxy based resin, a phenol based resin, a polybenzoxazole based resin, or a fluorine based resin can be used. The resin layer 6 is an insulating resin layer that functions as an interlayer insulating film insulating conductive layers such as the first wiring layer 5 from each other.

The wiring 4 and the first wiring layer 5 are electrically connected to each other via the solder 8. An underfill material is filled between the printed wiring substrate 2 including the wiring 4 and the resin layer 6 including the first wiring layer 5, and the underfill layer 9 made of the underfill material is formed.

The second wiring layer 7 has an adhesive layer 7A, a sputtering seed layer 73, and a copper electroplating layer 74 in this order. The second wiring layer 7 is formed so as to connect to the first wiring layer 5 through a via hole 10 on the resin layer 6 including the via hole 10 formed in the resin layer 6. For example, the via hole 10 is formed such that a part of the surface of the first wiring layer 5 is exposed by patterning a photoresist on the resin layer 6 by a photoresist method, for example. The second wiring layer 7 is a wiring formed by a semi-additive method, for example, after an adhesive layer and a seed layer are formed and laminated in an opening of the via hole 10 by a sputtering method. Note that the second wiring layer 7 may be any layer as long as it includes at least the adhesive layer 7A and the sputtering seed layer 73 in this order.

The second wiring layer 7 is electrically connected to the first wiring layer 5 at the bottom of the via hole 10. In the second wiring layer 7, the titanium layer 72, the sputtering seed layer 73, and the copper electroplating layer 74 are laminated in this order from the first wiring layer 5 side at the bottom of the via hole 10. Further, in the second wiring layer 7, the adhesive layer 7A, the sputtering seed layer 73, and the copper electroplating layer 74 are laminated in this order from the resin layer 6 side on the resin layer 6 insulating the first wiring layer 5 and the second wiring layer 7 from each other. The adhesive layer 7A is formed of a titanium carbide layer 71 and the titanium layer 72.

In such a way, the second wiring layer 7 has the titanium carbide layer 71, the titanium layer 72, the sputtering seed layer 73, and the copper electroplating layer 74 in this order and is formed as a laminated body connected to the first wiring layer 5 through the via hole 10. The titanium layer 72, the sputtering seed layer 73, and the copper electroplating layer 74 are laminated in this order from the first wiring layer 5 side on the first wiring layer 5 so that the first wiring layer 5 and the titanium layer 72 are electrically connected to each other at the bottom of the via hole 10. The titanium layer 72 is directly formed on the first wiring layer 5 without via the titanium carbide layer 71 at the bottom of the via hole 10. On the other hand, the titanium carbide layer 71, the titanium layer 72, the sputtering seed layer 73, and the copper electroplating layer 74 are laminated in this order from the resin layer 6 side on the resin layer 6 so that the first wiring layer 5 and the titanium layer 72 are insulated from each other in a portion except for the bottom of the via hole 10.

The adhesive layer 7A has the titanium carbide layer 71 and the titanium layer 72 in this order from the resin layer 6 side. The adhesive layer 7A has, on the resin layer 6 side, the titanium carbide layer 71 superior in adhesiveness to the resin layer 6 and has, on the sputtering seed layer 73 side, the titanium layer 72 superior in adhesiveness to the sputtering seed layer 73.

The titanium carbide layer 71 is formed of a titanium carbide (TiC) binding layer. The titanium carbide binding layer is formed such that, in a state where a titanium film has been formed on the resin layer 6, energy is applied thereto by ion irradiation, and thereby titanium elements contained in the titanium film and carbon (C) elements contained in the resin layer 6 are covalently bound (hereafter, also referred to as titanium carbide binding). The film thickness of the titanium film for forming the titanium carbide layer 71 is preferably 2.5 nm or greater. Further, the energy of ions emitted by ion irradiation is preferably 250 eV or greater. Herein, since the titanium carbide layer 71 can be formed even when the titanium film for forming the titanium carbide layer 71 is an extremely thin film having a film thickness of 2.5 nm, the titanium carbide layer 71 can be formed without a reduction of productivity. Further, since the energy of irradiated ions being 250 eV enables entry of ions in the depth direction over several nm from the outermost surface of the resin layer 6, the titanium carbide layer 71 can be efficiently formed.

The titanium layer 72 is formed of titanium (Ti). The film thickness of the titanium layer 72 may be 5 nm or greater and is preferably 20 nm to 200 nm. The titanium layer 72 can be formed by a method of sputtering a titanium target under an argon (Ar) atmosphere, for example.

The sputtering seed layer 73 is formed of copper (Cu). The sputtering seed layer 73 is a layer formed on the adhesive layer 7A by a sputtering method and is a seed layer for forming the copper electroplating layer 74. The film thickness of the sputtering seed layer 73 may be 50 nm or greater and is preferably 100 nm to 300 nm. The sputtering seed layer 73 can be formed by a method of sputtering a Cu target under an argon atmosphere, for example. In the present embodiment, since the sputtering seed layer 73 is formed over the resin layer 6 via the adhesive layer 7A, the adhesiveness between the resin layer 6 and the sputtering seed layer 73 is improved.

The copper electroplating layer 74 is formed of copper (Cu). The copper electroplating layer 74 can be laminated on the sputtering seed layer 73 by electroplating after the sputtering seed layer 73 is formed. The thickness of the copper electroplating layer 74 may be 5 µm or greater and is preferably 10 µm to 50 µm.

Figure 2:
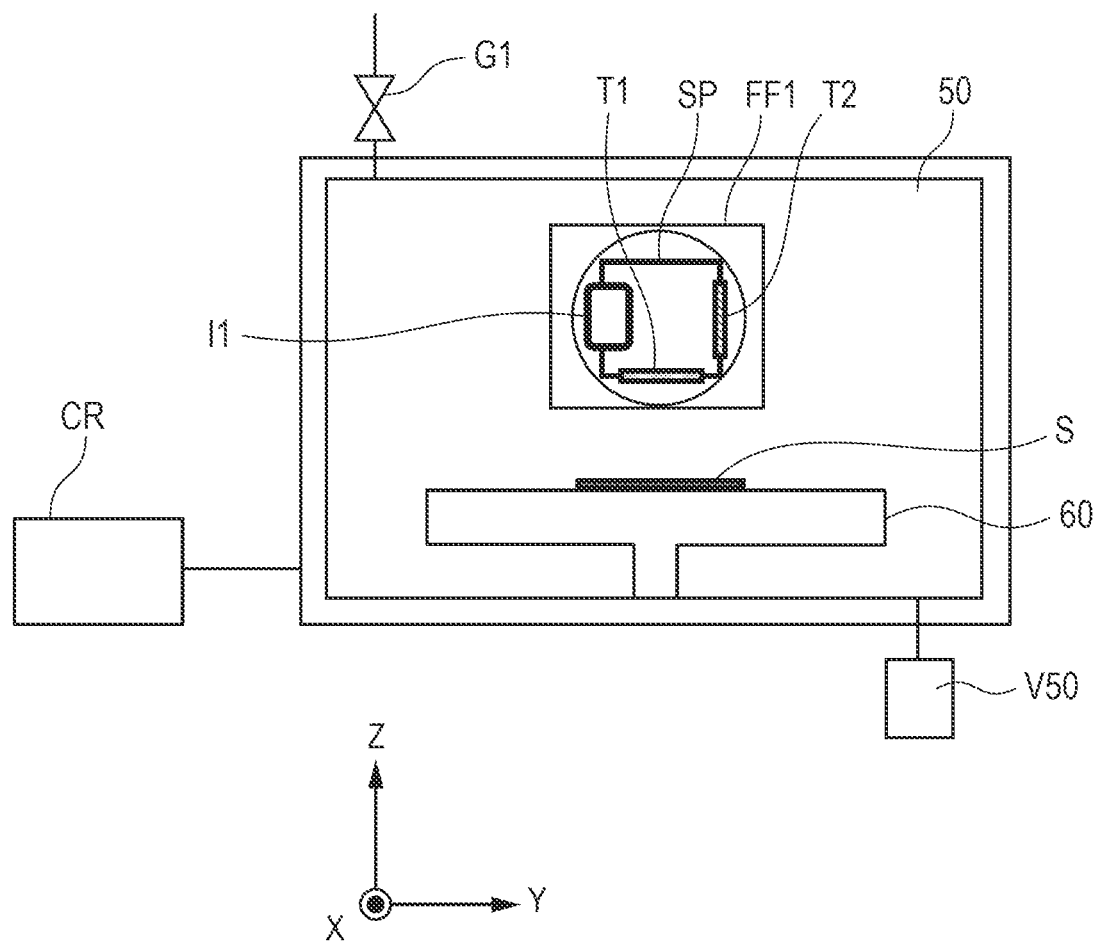
FIG. 2 is a sectional view of a film forming apparatus taken along a perpendicular plane according to the first embodiment of the present invention.

In such a way, in the wiring part 1 of the semiconductor package, the second wiring layer 7 connected to the first wiring layer 5 is formed. The adhesive layer 7A and the sputtering seed layer 73 of the second wiring layer 7 can be formed by using a film forming apparatus according to the present embodiment illustrated in FIG. 2, which is a single film forming apparatus. FIG. 2 is a sectional view of the film forming apparatus of the present embodiment taken along the perpendicular plane. Herein, the XY plane is a plane parallel to the horizontal plane, and the Z-axis is an axis parallel to the perpendicular direction.

As illustrated in FIG. 2, the film forming apparatus according to the present embodiment has a process chamber 50, a processing unit FF1, an exhaust unit V50, a gas introduction unit G1, a holding unit 60, and a control device CR. The processing unit FF1 is provided inside the process chamber 50 and configured to form the adhesive layer 7A and the sputtering seed layer 73 of the second wiring layer 7 corresponding to wirings connected to an electronic component on the substrate S. The exhaust unit V50 is configured to be able to vacuum the process chamber 50. The gas introduction unit G1 is configured to introduce a gas used for forming the adhesive layer 7A and the sputtering seed layer 73 into the process chamber 50. The holding unit 60 is formed to hold the substrate S in the process chamber 50. The control device CR is configured to control each unit of the film forming apparatus, such as the exhaust unit V50, the gas introduction unit G1, the processing unit FF1, or the like. Further, the film forming apparatus according to the present embodiment has a drive unit (not illustrated) that moves the holding unit 60 holding the substrate S so that the substrate S passes through a film forming region in the process chamber 50 and a cooling unit (not illustrated) that cools the holding unit 60.

The processing unit FF1 has a plurality of targets T1 and T2, which are sputtering targets, and an ion gun I1 and is formed of a rotary cathode that rotates a support SP supporting the plurality of targets T1 and T2 and the ion gun I1. The target T1 is a titanium (Ti) target, for example, and is preferably formed of a material for an adhesive film that functions as the adhesive layer 7A formed on the substrate S. For example, the processing unit FF1 deposits a titanium film by a sputtering method using the target T1. The target T2 is a copper (Cu) target, for example, and is preferably formed of a material for a seed film that functions as the sputtering seed layer 73 formed on the adhesive film. For example, the processing unit FF1 deposits a copper film by a sputtering method using the target T2. The ion gun I1 is configured to emit ions to the substrate S at desired energy. The processing unit FF1 irradiates the titanium film, for example, which is deposited using the target T1, with ions from the ion gun I1.

In the present embodiment, energy is applied to a titanium film and the resin layer 6 by ion irradiation in a state where the titanium film has been formed on the resin layer 6 to form the adhesive layer 7A having the titanium carbide layer 71 made of a titanium carbide binding layer, and the adhesive layer 7A functions as an excellent adhesive film.

When depositing the adhesive layer 7A, the control device CR first rotates the processing unit FF1 to cause the target T1 to face the substrate S and forms a Ti film on the substrate S by a sputtering method using the target T1. In such a state, the control device CR further rotates the processing unit FF1 to cause the ion gun I1 to face the substrate S, applies a voltage to the ion gun I1 to emit ions to the substrate S, and generates plasma from an argon gas introduced inside the process chamber 50 by the gas introduction unit G1. In response, energy is applied by ion irradiation to the titanium film formed on the resin layer 6 of the substrate S and the resin layer 6, and titanium elements contained in the titanium film and carbon elements contained in the resin layer 6 are covalently bound. Accordingly, the titanium carbide layer 71 can be formed from the titanium film. Further, without being limited to an argon gas alone, a mixed gas in which nitrogen or a reactive gas such as an oxygen gas is mixed with an argon gas may be used for the atmosphere gas at ion irradiation by the ion gun I1.

Figure 3:
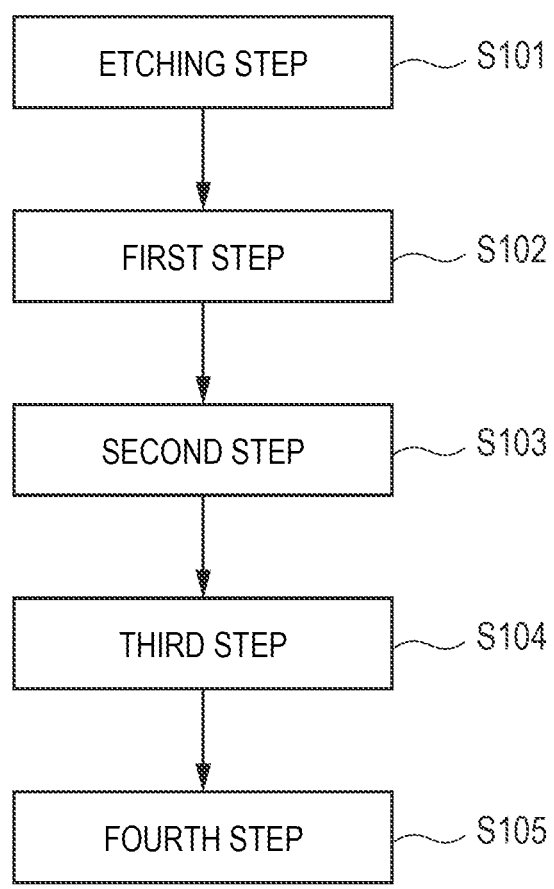
FIG. 3 is a flow diagram illustrating a laminated body manufacturing method according to the first embodiment of the present invention.
Figure 4A:
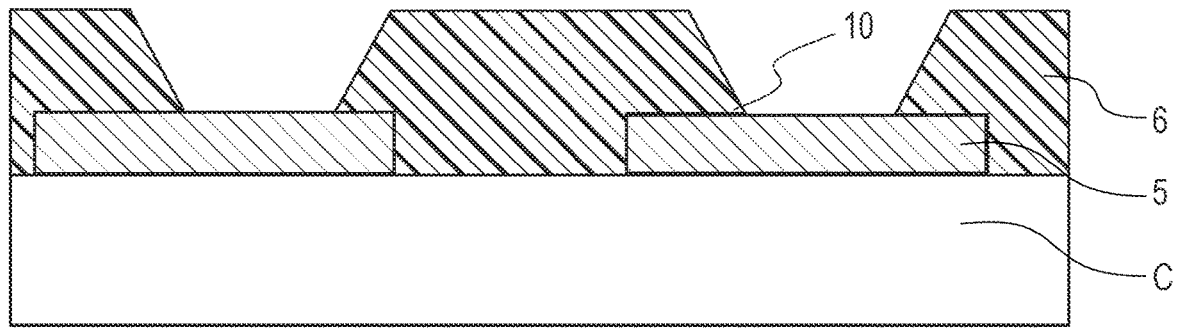
FIG. 4A is a step sectional view illustrating the laminated body manufacturing method according to the first embodiment of the present invention.
Figure 4B:
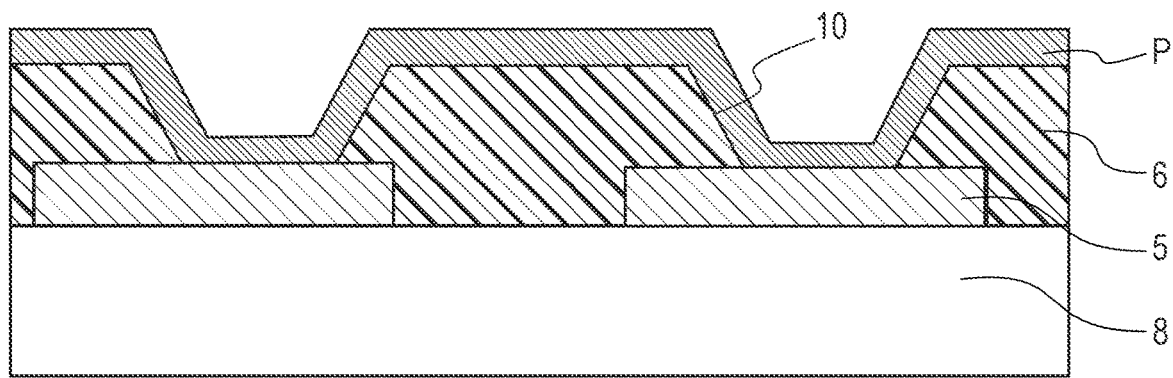
FIG. 4B is a step sectional view illustrating the laminated body manufacturing method according to the first embodiment of the present invention.
Figure 4C:
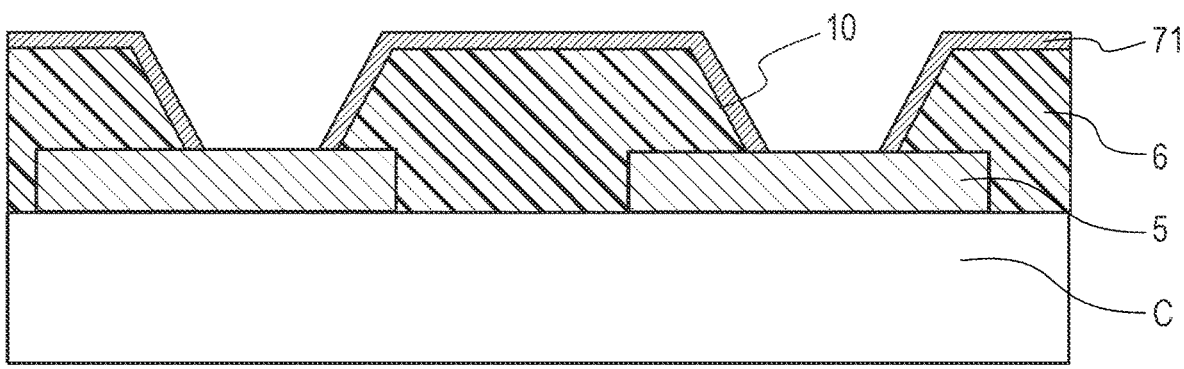
FIG. 4C is a step sectional view illustrating the laminated body manufacturing method according to the first embodiment of the present invention.
Figure 4D:
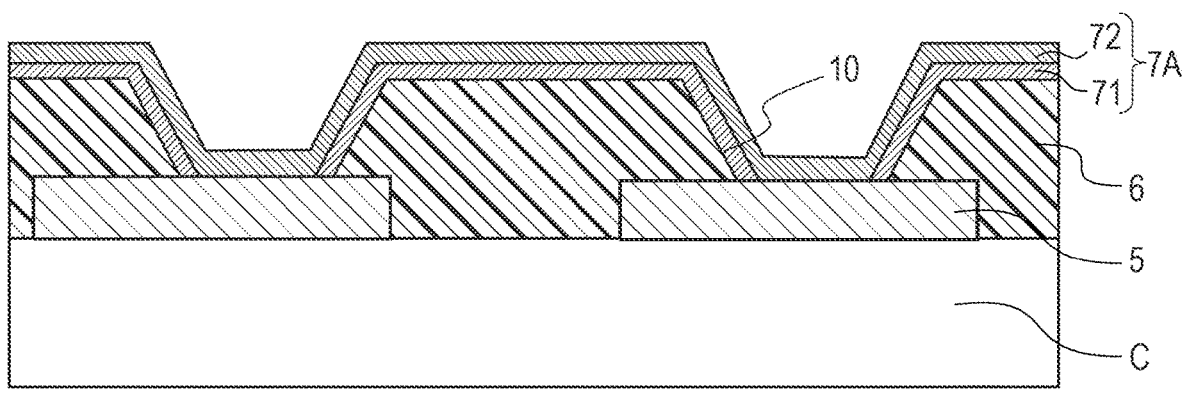
FIG. 4D is a step sectional view illustrating the laminated body manufacturing method according to the first embodiment of the present invention.
Figure 4E:
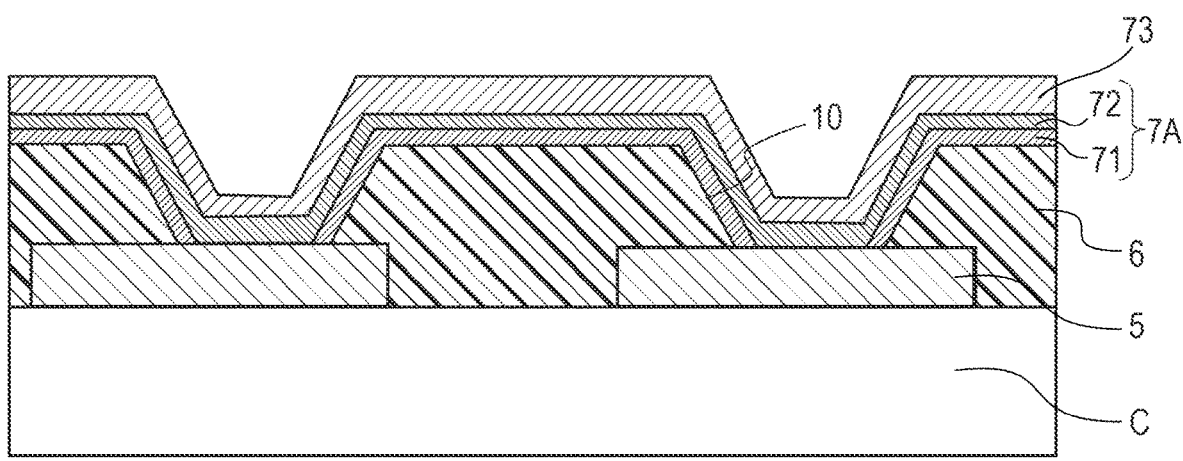
FIG. 4E is a step sectional view illustrating the laminated body manufacturing method according to the first embodiment of the present invention.

Next, a manufacturing method of a laminated body according to the present embodiment including the second wiring layer 7 performed by using the film forming apparatus illustrated in FIG. 2 will be further described with reference to FIG. 3 to FIG. 4E. FIG. 3 is a flow diagram illustrating the laminated body manufacturing method according to the present embodiment performed by the film forming apparatus illustrated in FIG. 2. FIG. 4A to FIG. 4E are step sectional views illustrating the laminated body manufacturing method according to the present embodiment, which specifically are step sectional views illustrating a manufacturing method of a wiring part of a semiconductor package.

One of the characterized features of the laminated body manufacturing method according to the present embodiment is that, when the second wiring layer 7 illustrated in FIG. 1 is formed, energy is applied to a titanium film and the resin layer 6 by ion irradiation in a state where the titanium film has been formed on the resin layer 6, and thereby the titanium carbide layer 71 is formed from the titanium film.

As illustrated in FIG. 3, the laminated body manufacturing method according to the present embodiment includes a first step (step S102), a second step (step S103), a third step (step S104), and a fourth step (step S105). Further, the laminated body manufacturing method according to the present embodiment may include an etching step (step S101) before the first step (step S102).

The first step (step S102) is to form a titanium film on the resin layer 6 and the bottom of the via hole 10. The second step (step S103) is to apply energy to the titanium film formed in the first step (step S102) by ion irradiation after the first step (step S102) to form a titanium carbide layer 71 of the adhesive layer 7A from the titanium film. The third step (step S104) is to form the titanium layer 72 of the adhesive layer 7A after the second step (step S103). The fourth step (step S105) is to form the sputtering seed layer 73 after the third step (step S104). The etching step (step S101) that may be performed before the first step (step S102) is to etch the surface of the substrate S to form the via hole 10 in the resin layer 6 before the first step (step S102).

Further, the first step (step S102) and the second step (step S103) may be performed twice or more. By repeatedly performing the first step (step S102) and the second step (step S103) twice or more, it is possible to change the binding ratio between titanium and carbon in the titanium carbide layer 71 from the resin layer 6 side to the titanium layer 72 side in a gradient manner. That is, it is possible to gradually reduce the binding ratio from the resin layer 6 side to the titanium layer 72 side. By changing the binding ratio between titanium and carbon in the titanium carbide layer 71 in a gradient manner in such a way, it is possible to improve the adhesiveness of the titanium carbide layer 71.

Each step described above is performed on the substrate S illustrated in FIG. 2. As illustrated in FIG. 4A, the substrate S is a substrate having a support substrate C, the first wiring layer 5 formed on the support substrate C by being patterned in a wiring pattern by a semi-additive method, for example, and on the support substrate C, a resin layer 6 formed including the first wiring layer 5. The via hole 10 reaching the first wiring layer 5 is patterned and formed in the resin layer 6. The support substrate C is not particularly limited and preferably is any of a silicon (Si) substrate, a substrate made of glass, and a substrate made of resin. After such a substrate S is introduced in the process chamber 50 and held by the holding unit 60, each step is performed as described below inside the process chamber 50.

First, in the etching step of step S101, the control device CR rotates the support SP supporting the plurality of targets T1 and T2 and the ion gun I1 to orient the ion gun I1 to the substrate S side and cause the ion gun I1 to face the substrate S. Next, the control device CR introduces an argon gas into the process chamber 50 from the gas introduction unit G1 to stabilize the pressure inside the process chamber 50 and then applies a voltage to the ion gun I1 to generate plasma from the argon gas. The plasma generated in such a way is used to etch the first wiring layer 5 on the support substrate C and the resin layer 6 in which the via hole 10 is patterned and reaches the first wiring layer 5, as illustrated in FIG. 4A. The surface of the substrate S is cleaned by this etching. The control device CR stops voltage application to the ion gun I1 at the point of time when the etching step of step S101 is completed.

Next, in the first step of step S102, the control device CR rotates the support SP supporting the plurality of targets T1 and T2 and the ion gun I1 to orient the target T1 to the substrate S side and cause the target T1 to face the substrate S. Next, after the pressure in the process chamber 50 is stabilized, the control device CR supplies pre-set power to the target T1 to generate plasma from the argon gas. The target T1 is sputtered by the plasma generated in such a way, and thereby a titanium film P is deposited on the resin layer 6 and the first wiring layer 5 exposed at the bottom of the via hole 10, as illustrated in FIG. 4B.

Next, in the second step of the step S103, the control device CR rotates the support SP supporting the plurality of targets T1 and T2 and the ion gun I1 to orient the ion gun I1 to the substrate S side and cause the ion gun I1 to face the substrate S. Next, the control device CR introduces an argon gas into the process chamber 50 from the gas introduction unit G1 to stabilize the pressure inside the process chamber 50 and then applies a voltage to the ion gun I1 to generate plasma from the argon gas. The energy is applied to the titanium film P and the resin layer 6 by ion irradiation by the ion gun I1 in such a way, thereby the surface of the resin layer 6 of the substrate S is modified, and titanium carbide binding is formed between titanium elements contained in the titanium film P and the carbon elements contained in the resin layer 6. Accordingly, as illustrated in FIG. 4C, the titanium carbide layer 71 forming a part of the adhesive layer 7A as a layer closer to the resin layer 6 of the adhesive layer 7A is formed from the titanium film P. At this time, as a result of etching and removal of the titanium film P by ion irradiation, the first wiring layer 5 is exposed at the bottom of the via hole 10. Note that the titanium carbide layer 71 may be partially formed in at least a portion on the resin layer 6 side of the titanium film P.

Next, in the third step of step S104, the control device CR rotates the support SP supporting the plurality of targets T1 and T2 and the ion gun I1 to orient the target T1 to the substrate S side and cause the target T1 to face the substrate S. Next, after the pressure in the process chamber 50 is stabilized, the control device CR supplies pre-set power to the target T1 to generate plasma from the argon gas. The target T1 is sputtered by the plasma generated in such a way, and thereby the titanium layer 72 forming a part of the adhesive layer 7A as an upper layer of the adhesive layer 7A is formed on the titanium carbide layer 71, as illustrated in FIG. 4D. The titanium layer 72 is formed on the surface of the first wiring layer 5 and the surface of the titanium carbide layer 71.

Next, in the fourth step of step S105, the control device CR rotates the support supporting the plurality of targets T1 and T2 and the ion gun I1 to orient the target T2 to the substrate S side and cause the target T2 to face the substrate S. Next, after the pressure in the process chamber 50 is stabilized, the control device CR supplies pre-set power to the target T2 to generate plasma from the argon gas. The target T2 is sputtered by the plasma generated in such a way, and thereby the sputtering seed layer 73 is formed on the titanium layer 72 of the adhesive layer 7A, as illustrated in FIG. 4E. The sputtering seed layer 73 is not particularly limited and is preferably any of a Cu film, a CuAl alloy film, and a CuW alloy film. The target T2 can be changed as appropriate in accordance with the type of a film to be formed.

In such a way, the adhesive layer 7A and the sputtering seed layer 73 can be formed to the substrate S by using the film forming apparatus illustrated in FIG. 2.

After the formation up to the sputtering seed layer 73, the substrate S is taken out of the film forming apparatus illustrated in FIG. 2, and the copper electroplating layer 74 can be formed on the sputtering seed layer 73 by electroplating using the sputtering seed layer 73 as a seed layer. In such a way, the second wiring layer 7 having the adhesive layer 7A, the sputtering seed layer 73, and the copper electroplating layer 74 is formed on the resin layer 6.

As set forth, in the present embodiment, the surface of the resin layer 6 is modified by ion irradiation, and thereby the titanium carbide layer 71 containing titanium elements forming the titanium layer 72 of the adhesive layer 7A is formed between the resin layer 6 and the titanium layer 72. Accordingly, the adhesiveness between the resin layer 6 and the second wiring layer 7 including the sputtering seed layer 73 can be improved. In the present embodiment, energy is applied by ion irradiation, thereby dangling bonds are induced on the resin layer 6, titanium elements are bound to carbon elements of the resin layer 6, and the titanium carbide layer 71 is formed between the resin layer 6 and the titanium layer 72. Because adhesive force between the resin layer 6 and the titanium layer 72 of the adhesive layer 7A is enhanced by such the titanium carbide layer 71, the adhesiveness between the resin layer 6 and the second wiring layer 7 in which the adhesive layer 7A, the sputtering seed layer 73, and the copper electroplating layer 74 are laminated in this order can be ensured.

As described above, according to the present embodiment, since the sputtering seed layer 73 is formed over the resin layer 6 via the adhesive layer 7A having the titanium carbide layer 71 and the titanium layer 72, the adhesiveness between the resin layer 6 and the sputtering seed layer 73 can be improved.

Note that the film of the resin layer 6 including the first wiring layer 5 and the second wiring layer 7 can be used for manufacturing of a semiconductor package illustrated in FIG. 1 after separated from the support substrate C. When the semiconductor package is manufactured, the first wiring layer 5 in the film of the resin layer 6 is connected to the wiring 4 of the printed wiring substrate 2 by the solder 8. Next, an underfill material is filled between the printed wiring substrate 2 and the film of the resin layer 6 to form the underfill layer 9.

Second Embodiment

A laminated body and a laminated body manufacturing method according to a second embodiment of the present invention will be described with reference to FIG. 5. Note that components similar to those of the laminated body and the laminated body manufacturing method in the first embodiment are labeled with the same references, and the description thereof will be omitted or simplified.

Figure 5:
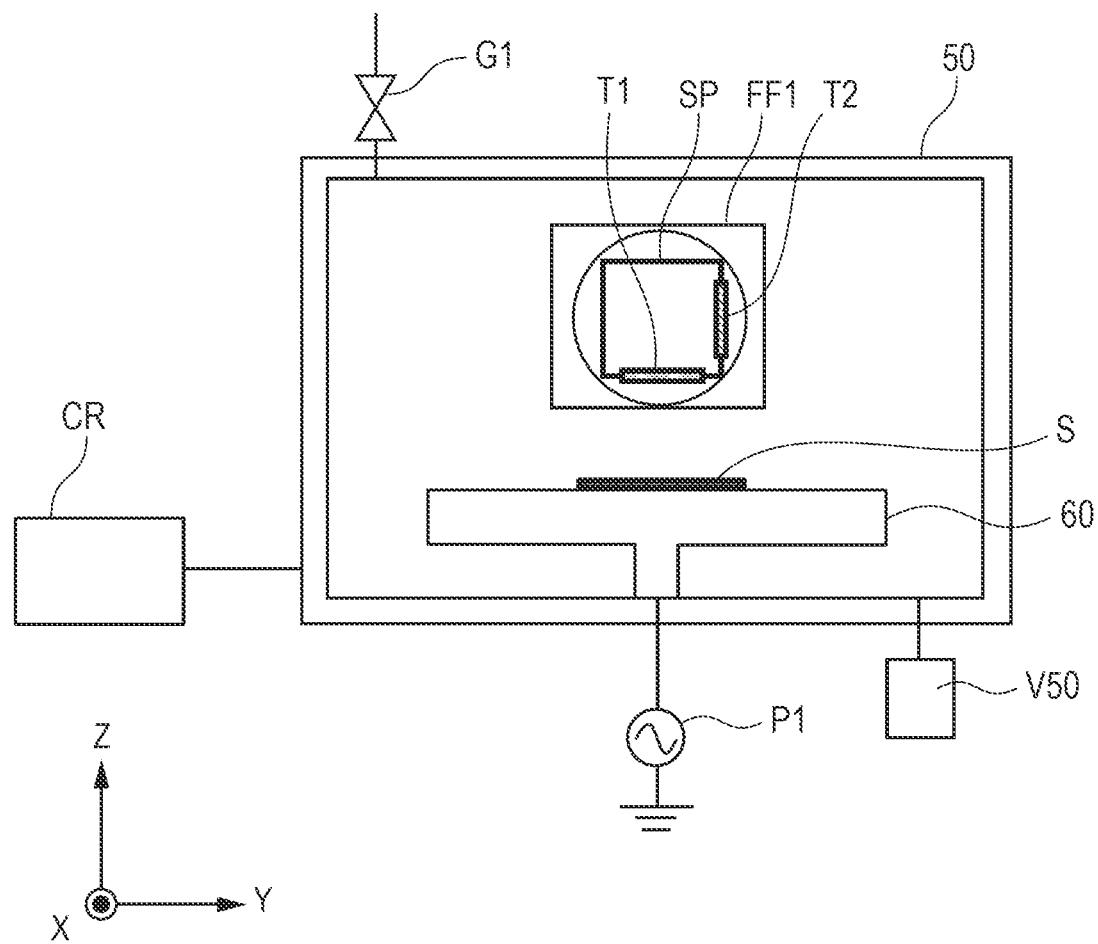
FIG. 5 is a sectional view of a film forming apparatus taken along a perpendicular plane according to a second embodiment of the present invention.

The present embodiment differs from the first embodiment in that the adhesive layer 7A and the sputtering seed layer 73 are formed by using a film forming apparatus illustrated in FIG. 5 instead of the film forming apparatus illustrated in FIG. 2. FIG. 5 is a sectional view of the film forming apparatus according to the present embodiment taken along a perpendicular plane. Herein, the XY plane is a plane parallel to the horizontal plane, and the Z-axis is an axis parallel to the perpendicular direction.

The basic configuration of the film forming apparatus according to the present embodiment is similar to that of the film forming apparatus illustrated in FIG. 2. As illustrated in FIG. 5, the film forming apparatus according to the present embodiment differs from the film forming apparatus illustrated in FIG. 2 in that, while the ion gun I1 is not installed, a high-frequency power source P1 configured to be able to apply a high-frequency voltage via the holding unit 60 to the substrate S held by the holding unit 60 is provided. As the high-frequency power source P1, a high-frequency power source with variable output voltages can be used. Note that, also in the film forming apparatus according to the present embodiment, the ion gun I1 may be installed for performing the etching step of step S101.

The laminated body manufacturing method according to the present embodiment using the film forming apparatus illustrated in FIG. 5 is similar to the laminated body manufacturing method according to the first embodiment except for the second step of step S103. The second step of step S103 can also be implemented by a method of applying a high-frequency voltage to the substrate S. In the present embodiment, the second step of step S103 is performed by applying a high-frequency voltage to the substrate S by using the high-frequency power source P1, which is a high-frequency voltage application mechanism, as described below.

Specifically, in the second step of step S103, the control device CR rotates the support SP supporting the plurality of targets T1 and T2 to orient a surface of the processing unit FF1 to the substrate S side, where the surface does not have the targets T1 and T2 installed. Next, the control device CR applies a high-frequency voltage to the substrate S by using the high-frequency power source P1 to generate plasma, draws ions from the plasma to the substrate S by using a self-bias voltage Vdc occurring on the substrate S, and applies energy to the titanium film P and the resin layer 6 formed in the first step of step S102. Such application of energy modifies the surface of the resin layer 6 of the substrate S to form the titanium carbide layer 71 that is a layer closer to the resin layer 6 of the adhesive layer 7A in the same manner as the first embodiment illustrated in FIG. 4C.

As with the present embodiment, it is also possible to form the titanium carbide layer 71 by applying energy to the titanium film P and the resin layer 6 with drawn ions from a high-frequency power source applied by the high-frequency power source P1 instead of ion irradiation using the ion gun I1.

Third Embodiment

A laminated body and a laminated body manufacturing method according to a third embodiment of the present invention will be described with reference to FIG. 6. Note that components similar to those of the laminated body and the laminated body manufacturing method in the first and second embodiments are labeled with the same references, and the description thereof will be omitted or simplified.

Figure 6:
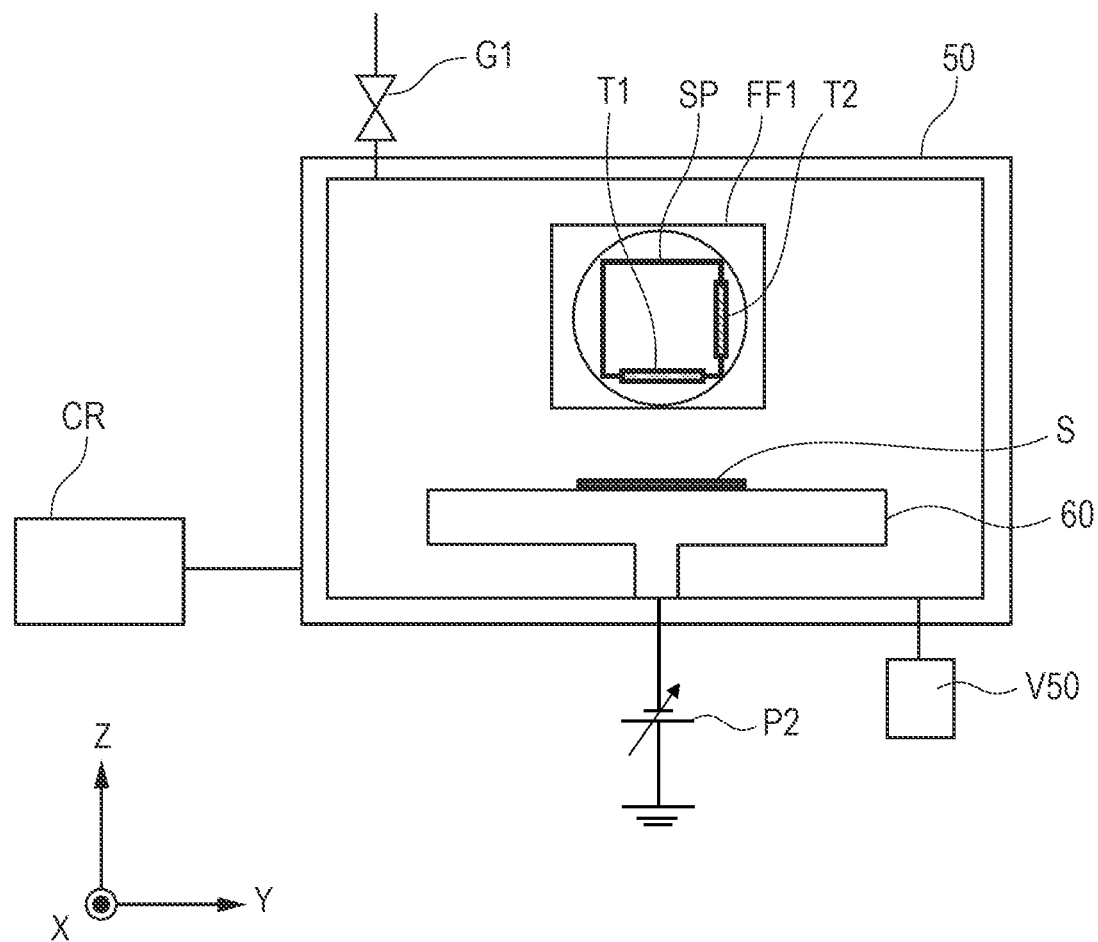
FIG. 6 is a sectional view of a film forming apparatus taken along a perpendicular plane according to a third embodiment of the present invention.

The present embodiment differs from the first embodiment in that the adhesive layer 7A and the sputtering seed layer 73 are formed by using a film forming apparatus illustrated in FIG. 6 instead of the film forming apparatus illustrated in FIG. 2. FIG. 6 is a sectional view of the film forming apparatus according to the present embodiment taken along a perpendicular plane. Herein, the XY plane is a plane parallel to the horizontal plane, and the Z-axis is an axis parallel to the perpendicular direction.

The basic configuration of the film forming apparatus according to the present embodiment is similar to that of the film forming apparatus illustrated in FIG. 2. As illustrated in FIG. 6, the film forming apparatus according to the present embodiment differs from the film forming apparatus illustrated in FIG. 2 in that, while the ion gun I1 is not installed, a DC power source P2 configured to be able to apply a DC voltage via the holding unit 60 to the substrate S held by the holding unit 60 is provided. As the DC power source P2, a DC power source with variable output voltages can be used. Note that, also in the film forming apparatus according to the present embodiment, the ion gun I1 may be installed for performing the etching step of step S101.

The laminated body manufacturing method according to the present embodiment using the film forming apparatus illustrated in FIG. 6 is similar to the manufacturing method according to the first embodiment except for the second step of step S103. The second step of step S103 can also be performed by a method of depositing a titanium film with a negative bias voltage being applied to the substrate S. In the present embodiment, the second step of step S103 is performed by depositing the titanium film with a negative bias voltage being applied to the substrate S by the DC power source P2, which is a DC voltage application mechanism, as described below.

Specifically, in the second step of step S103, the control device CR rotates the support SP supporting the plurality of targets T1 and T2 to orient the target T1 to the substrate S side and cause the target T1 to face the substrate S. Next, after the pressure in the process chamber 50 is stabilized, the control device CR supplies pre-set power to the target T1 with a negative bias voltage being applied to the substrate S by the DC power source P2 to generate plasma from the argon gas. Accordingly, while a titanium film is being deposited by sputtering, ions from the plasma are drawn to the substrate S by using the negative bias voltage, and energy is applied to the titanium film P and the resin layer 6 formed in the first step of step S102. Such application of energy modifies the surface of the resin layer 6 of the substrate S to form the titanium carbide layer 71 that is a layer closer to the resin layer 6 of the adhesive layer 7A in the same manner as the first embodiment illustrated in FIG. 4C. Herein, the bias voltage applied to the substrate S by the DC power source P2 is preferably a DC pulse bias voltage. The negative bias voltage applied to the substrate S may be constant or may be changed stepwise over time.

According to the present embodiment, even a film forming apparatus having neither the ion gun I1 nor the high-frequency power source P1 can form the titanium carbide layer 71.

Fourth Embodiment

A laminated body and a laminated body manufacturing method according to a fourth embodiment of the present invention will be described. Note that components similar to those of the laminated body and the laminated body manufacturing method in the first to third embodiments are labeled with the same references, and the description thereof will be omitted or simplified.

It is also possible to perform the first step of step S102 and the second step of step S103 at the same time. The laminated body manufacturing method according to the present embodiment performs the first step of step S102 and the second step of step S103 at the same time as described below by using the film forming apparatus illustrated in FIG. 6.

Specifically, in performing the first step of step S102 and the second step of step S103 at the same time, the control device CR rotates the support SP supporting the plurality of targets T1 and T2 to orient the target T1 to the substrate S side and cause the target T1 to face the substrate S. Next, after the pressure in the process chamber 50 is stabilized, the control device CR supplies pre-set power to the target T1 with a negative bias voltage applied to the substrate S by the DC power source P2 to generate plasma from the argon gas. Since the titanium film is deposited while energy is being applied by ion irradiation with the negative bias voltage, titanium elements contained in the titanium film and carbon elements contained in the resin layer 6 are covalently bound. Such deposition of the titanium film with application of energy modifies the surface of the resin layer 6 of the substrate S to form the titanium carbide layer 71 that is a layer closer to the resin layer 6 of the adhesive layer 7A in the same manner as the first embodiment illustrated in FIG. 4C. Herein, the bias voltage applied to the substrate S by the DC power source P2 is preferably a DC pulse bias voltage. The negative bias voltage applied to the substrate S may be constant or may be changed stepwise over time.

According to the present embodiment, by performing the first step of step S102 and the second step of step S103 at the same time, it is possible to achieve improvement in productivity, and even a film forming apparatus having neither the ion gun I1 nor the high-frequency power source P1 can form the titanium carbide layer 71.

Examples of the present invention will be described below with reference to FIG. 7 to FIG. 9.

The binding state of the interface between a resin layer and an adhesive film was measured by an X-ray photoelectron spectroscope (SSX-100, by Surface Science Instruments). The measurement was made nondestructively, and the X-ray source was AlKα (1487 eV) and arranged such that the angle between the sample table and the analyzer was 90 degrees so that the detection depth of photoelectrons is the largest. Measuring samples were produced by performing steps up to the second step of step S103 of the film forming flow illustrated in FIG. 3, that is, performing the etching step of step S101, the first step of step S102, and the second step of step S103 in the method according to the first embodiment. A titanium film of 3 nm was deposited in the first step of step S102. Further, samples on which the second step of step S103 was not performed were produced for comparison. Note that, since generated photoelectrons are subjected to inelastic scattering inside the sample in X-ray photoelectron spectroscopy, it is not possible to analyze the interface between a resin layer and an adhesive film when the film thickness of the titanium film is large. Thus, the samples were produced so that the film thickness of the titanium film is 10 nm or less.

Figure 7:
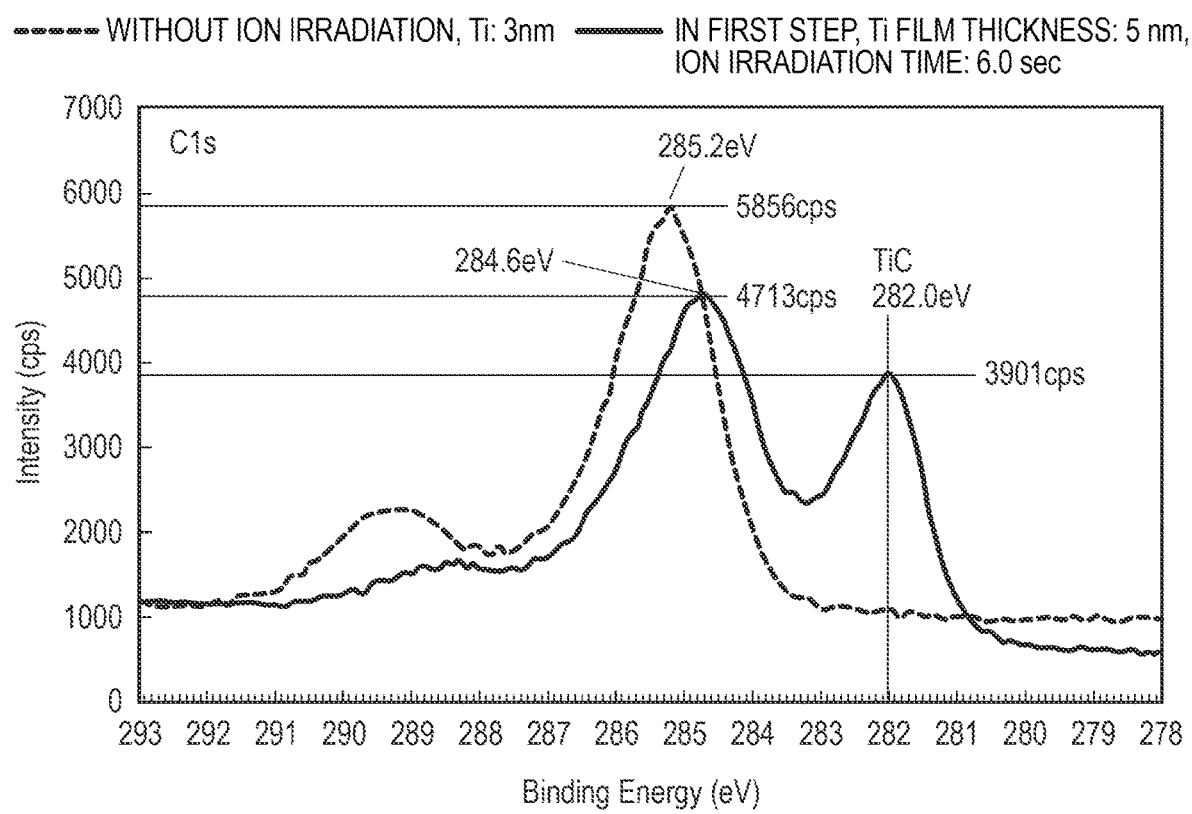
FIG. 7 is a diagram illustrating an example of C1s spectrum obtained by X-ray photoelectron spectroscopy measurement.
Figure 8:
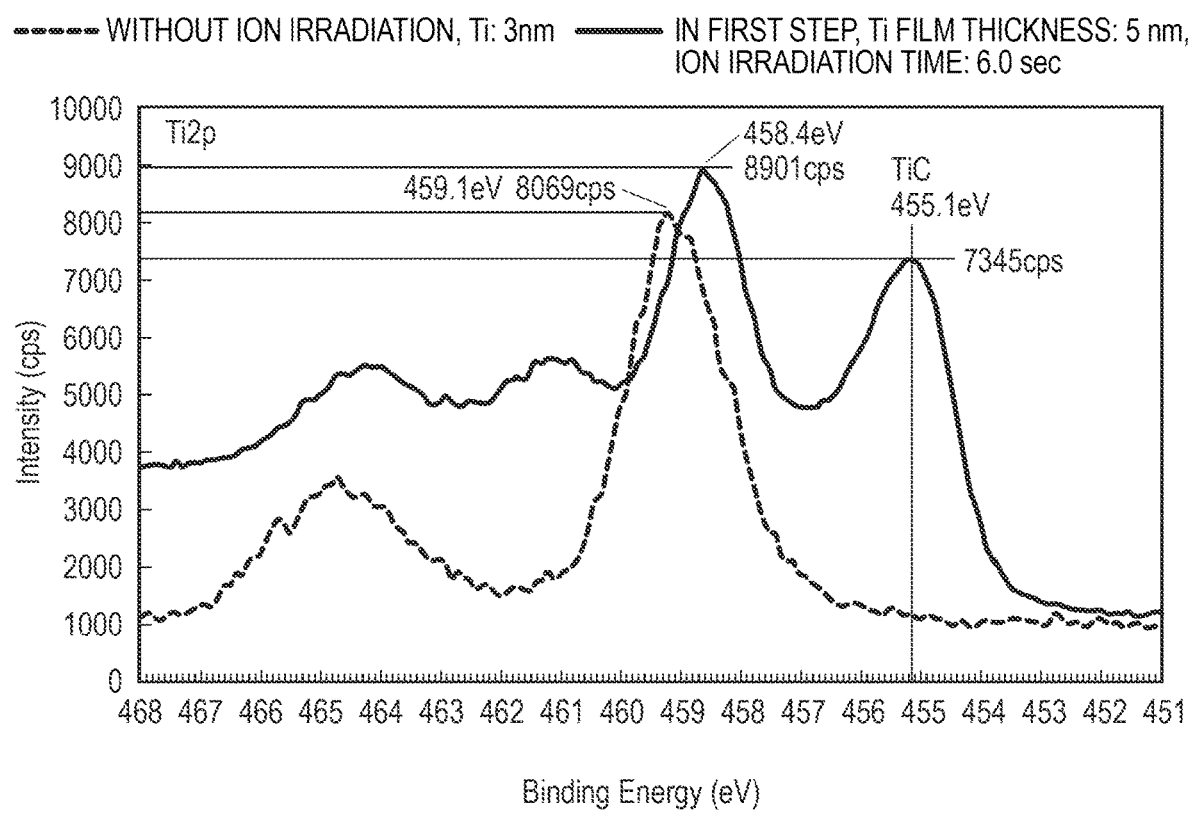
FIG. 8 is a diagram illustrating an example of Ti2p spectrum obtained by X-ray photoelectron spectroscopy measurement.

FIG. 7 is a diagram illustrating examples of C1s spectra obtained by the X-ray photoelectron spectroscopy measurement, and FIG. 8 is a diagram illustrating examples of Ti2p spectra. The horizontal axis of FIG. 7 and FIG. 8 represents the binding energy of measured electrons to atomic nuclei, and the vertical axis thereof represents the intensity of emitted photoelectrons. In FIG. 7 and FIG. 8, the solid line spectrum represents an example of a measurement result for the measuring sample on which steps up to the second step of step S103 were performed, and the dashed line spectrum represents an example of a measurement result for the comparative sample on which the second step of step S103 was not performed. Elements have different binding energy in accordance with the state of binding to a near neighbor atom. It is thus possible to obtain information about the binding state from binding energy.

First, in comparison of the C1s spectra illustrated in FIG. 7, for the measuring sample where ion irradiation was performed in the second step on the titanium thin film on the resin layer formed in the first step, a peak was detected near 282.0 eV that was not observed in the comparative sample without ion irradiation. Next, in comparison of the Ti2p spectra illustrated in FIG. 8, for the measuring sample where ion irradiation was performed in the second step on the titanium thin film on the resin layer formed in the first step, a peak was detected near 455.0 eV that was not observed in the comparative sample without ion irradiation.

The peak near 282.0 eV of the C1s spectrum of FIG. 7 and the peak near 455.0 eV of the Ti2p spectrum of FIG. 8 are peaks due to titanium carbide binding in which carbon and titanium are bound, respectively. In the measurement results illustrated in FIG. 7 and FIG. 8, the peaks of the binding energy due to titanium carbide binding were detected, and it was confirmed that titanium carbide binding was formed.

Next, Table 1 illustrates a result of examination as to whether or not titanium carbide binding was formed for each film thickness of a titanium thin film and for each ion irradiation time when ion irradiation was performed on the titanium thin film on the resin layer by the scheme of the first embodiment. Whether or not titanium carbide binding was formed was confirmed by X-ray photoelectron spectroscopy.

TABLE 1

| FILM THICKNESS OF TITANIUM THIN FILM FORMED IN FIRST STEP | ION IRRADIATION TIME | FORMATION OF TITANIUM CARBIDE BINDING |
|---|---|---|
| 3 nm | 0 sec | Not formed |
| 2.5 nm | 0 sec | Not formed |
|  | 1.5 sec | Formed |
|  | 2.0 sec | Formed |
|  | 3.0 sec | Formed |
|  | 6.0 sec | Formed |

TABLE 1-continued

| FILM THICKNESS OF TITANIUM THIN FILM FORMED IN FIRST STEP | ION IRRADIATION TIME | FORMATION OF TITANIUM CARBIDE BINDING |
|---|---|---|
| 5 nm | 6.0 sec | Formed |
|  | 12 sec | Formed |
| 10 nm | 21 sec | Formed |
|  | 27 sec | Formed |
| 25 nm | 60 sec | Formed |
|  | 66 sec | Formed |
|  | 72 sec | Formed |

As illustrated in Table 1, the obtained result was that no titanium carbide binding is formed when no ion irradiation is performed after the deposition of the titanium film, and in contrast, titanium carbide binding is formed when the ion irradiation is performed on the titanium thin film on the resin layer formed in the first step. Further, with the film thickness of the titanium thin film being 2.5 nm or greater, it was confirmed that titanium carbide binding is formed when the ion irradiation is performed.

Next, Table 2 illustrates a result of examination as to whether or not titanium carbide binding was formed for each ion energy when the ion irradiation was performed on the titanium thin film having a film thickness of 5 nm formed on the resin layer by the scheme of the first embodiment.

TABLE 2

| FILM THICKNESS OF TITANIUM THIN FILM FORMED IN FIRST STEP | ION IRRADIATION TIME | ION ENERGY | FORMATION OF TITANIUM CARBIDE BINDING |
|---|---|---|---|
| 5 nm | 12 sec | 250 eV | Formed |
|  |  | 300 eV | Formed |
|  |  | 1000 eV | Formed |

As illustrated in Table 2, the obtained result was that titanium carbide binding is formed by the ion irradiation being performed on a titanium thin film on a resin layer.

Figure 9:
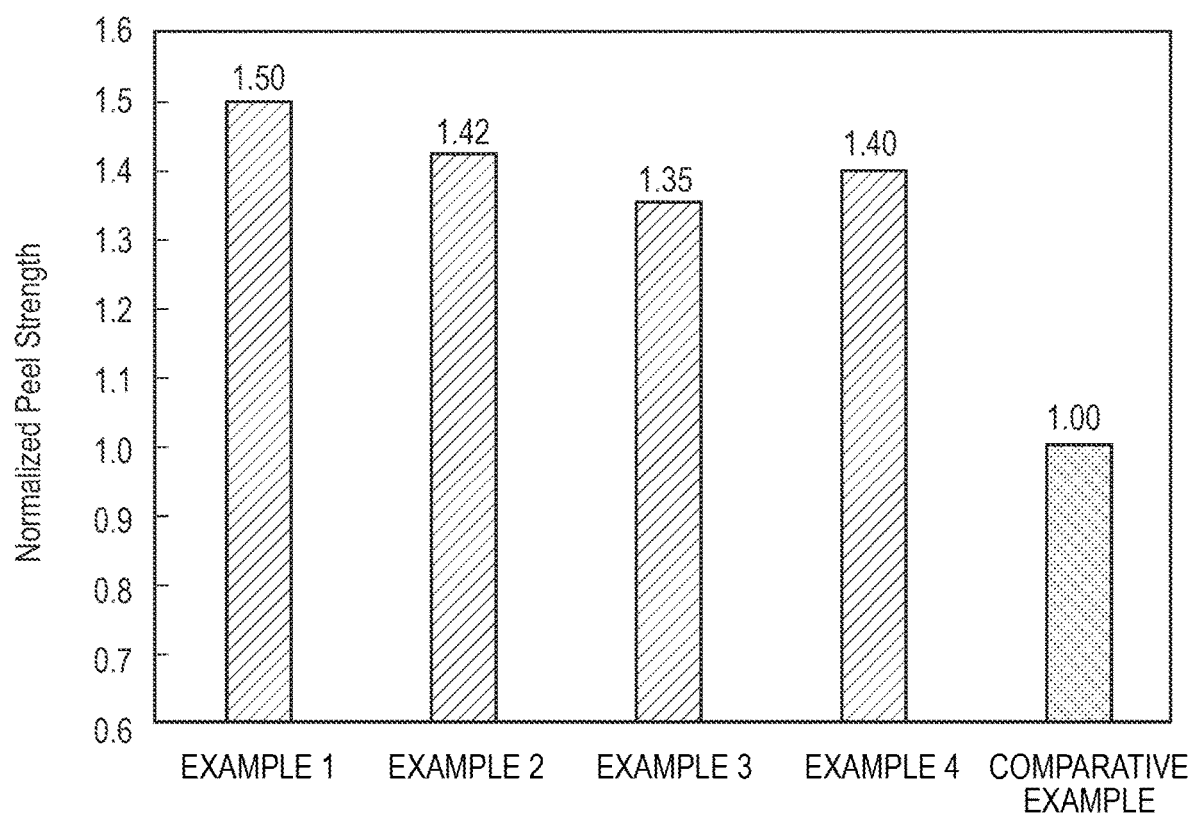
FIG. 9 is a diagram illustrating a measurement result of a 90-degree peeling test on laminated bodies obtained in the embodiments of the present invention.

Next, FIG. 9 illustrates a result of measurement of peel strength for the laminated bodies obtained in Examples 1 to 4 and the laminated body obtained in Comparative Example. FIG. 9 is a graph illustrating peel strength measured for the laminated bodies obtained in Examples 1 to 4 and the laminated body obtained in Comparative Example.

The laminated body obtained in Example 1 is the laminated body obtained in the first embodiment. The laminated body obtained in Example 2 is the laminated body obtained in the second embodiment. The laminated body obtained in Example 3 is the laminated body obtained in the third embodiment. The laminated body obtained in Example 4 is the laminated body obtained in the fourth embodiment. In each Example, a photosensitive polyimide resin layer was used as the resin layer 6.

The laminated body obtained in Comparative Example is similar to the laminated body obtained in Example 1 except that the first step of step S102 and the second step of step S103 were not performed. In Comparative Example, without the first step of step S102 and the second step of step S103 being performed, a titanium carbide layer was formed instead by a method of sputtering a titanium carbide target under an argon atmosphere before the third step of step S104.

In the measurement of peel strength, a peel tester (autograph AG-100kNXplus, by SHIMADZU CORPORATION) was used to perform 90-degree peeling test. In the 90-degree peeling test, the peeling strength when the second wiring layer 7 in which the adhesive layer 7A, the sputtering seed layer 73, and the copper electroplating layer 74 are laminated in this order and the resin layer 6 were peeled from each other was measured. Note that the 90-degree peeling test was performed at a test room temperature of 23±2° C. and at a test room humidity of 50±5% RH, and a test rate was 10 mm/min. FIG. 9 illustrates normalized peel strength of the laminated bodies obtained in Examples 1 to 4 and Comparative Example.

As illustrated in FIG. 9, it was found that the peel strength measured for the laminated bodies of Examples 1 to 4 is higher by 1.35 times to 1.5 times than the peel strength measured for the laminated body of Comparative Example. It was confirmed that the adhesiveness between the resin layer that is an interlayer insulating film and the seed layer can be improved by application of the present invention.

MODIFIED EMBODIMENTS

Although the preferred first to fourth embodiments of the present invention have been described above, the present invention is not limited to these first to fourth embodiments, and various modifications and changes can be made within the scope of the spirit thereof.

For example, although the case where the adhesive layer 7A is a layer containing Ti has been described as an example in the above first to fourth embodiments, the adhesive layer 7A is not limited to the layer containing Ti. As the adhesive layer 7A, a layer containing Ta, Ni, Cr, TiN, a Ti alloy, a Ta alloy, a Ni alloy, a Cr alloy, or the like used as an adhesive film between a Cu seed layer and a resin layer such as an interlayer insulating film may be used, for example. In such a case, the adhesive layer 7A can be a laminated body or the like having a metal carbide layer on the resin layer 6 side, such as a TaC layer and a Ta layer; a NiC layer and a Ni layer; a CrC layer and a Cr layer; a TiNC layer and a TiN layer; a Ti alloy-C layer and a Ti alloy layer; a Ta alloy-C layer and a Ta alloy layer; a Ni alloy-C layer and a Ni alloy layer; a Cr alloy-C layer and a Cr alloy layer, or the like. The metal carbide layer can be formed in the same manner as the titanium carbide layer 71 according to each of the first to fourth embodiments described above.

Further, although the case where the sputtering seed layer 73 is a Cu layer has been described as an example in the above first to fourth embodiments, the sputtering seed layer 73 is not limited to the Cu layer. As the sputtering seed layer 73, an alloy layer containing Cu, such as a CuAl alloy layer, a CuW alloy layer, or the like can also be used, for example.

Further, although the case where the resin layer 6 is an insulating resin layer that functions as an interlayer insulating film in the wiring part 1 of a semiconductor package has been described as an example in the above first to fourth embodiments, the resin layer 6 is not limited to an insulating resin layer that functions as an interlayer insulating film in the wiring part 1 of a semiconductor package. For example, the resin layer 6 may be a resin substrate used as a printed substrate, specifically, may be a glass epoxy substrate, a fluorine resin substrate, a polyimide film, or the like. In such a case, the laminated body may be one having a resin substrate as the resin layer 6, the adhesive layer 7A, and the sputtering seed layer 73 in this order.

According to the present invention, the adhesiveness between a resin layer and a seed layer can be improved. Other features and advantages of the present invention will be apparent from the following description with reference to the attached drawings. Note that, throughout the attached drawings, the same or similar features are labeled with the same reference numeral.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A laminated body manufacturing method comprising:
a first step of forming a titanium film on a resin layer;
after the first step, a second step of forming a titanium carbide layer, as a part of an adhesive layer, on the resin layer by applying energy to the titanium film;
after the second step, a third step of forming a titanium layer as another part of the adhesive layer on the titanium carbide layer; and
after the third step, a fourth step of forming a seed layer on the titanium layer,
wherein the titanium carbide layer is a layer formed with titanium from the titanium film and carbon from the resin layer, which are covalently bonded by applying the energy in a state where the titanium film is formed on the resin layer.

2. The laminated body manufacturing method according to claim 1, wherein the second step applies the energy to the titanium film by ion irradiation in a state where the titanium film was formed on the resin layer and forms the titanium carbide layer from the titanium film.

3. The laminated body manufacturing method according to claim 1, wherein the second step applies a high-frequency voltage to a substrate to generate plasma, the resin layer being formed on the substrate, draws ions by a self-bias voltage occurring on the substrate, applies the energy to the titanium film, and forms the titanium carbide layer from the titanium film.

4. The laminated body manufacturing method according to claim 1, wherein the second step applies a negative bias voltage to a substrate, the resin layer being formed on the substrate, draws ions by the negative bias voltage, applies the energy to the titanium film, and forms the titanium carbide layer from the titanium film.

5. The laminated body manufacturing method according to claim 1, comprising applying a negative bias voltage to a substrate on which the resin layer is formed and depositing the titanium film while applying energy by ion irradiation with the negative bias voltage.

6. The laminated body manufacturing method according to claim 1, wherein the second step applies the energy to the titanium film to modify a surface of the resin layer and forms the titanium carbide layer on at least a portion of the titanium film, the portion being on a resin layer side.

7. The laminated body manufacturing method according to claim 1, further comprising, before the first step, an etching step of etching a first wiring layer and the resin layer in which a via hole reaching the first wiring layer is formed.

8. The laminated body manufacturing method according to claim 7, wherein the first step forms the titanium film on the first wiring layer and on the resin layer.

9. The laminated body manufacturing method according to claim 8, wherein the third step forms the titanium layer on a surface of the first wiring layer and on a surface of the titanium carbide layer.

* * * * *